March 20, 1951 C. R. KNIGHT 2,546,033

MAGNETICALLY CONTROLLED ELECTRON DISCHARGE AMPLIFIER CIRCUITS

Filed June 7, 1946 2 Sheets-Sheet 1

Inventor:
Chester R. Knight,
by Merton D. Morse
His Attorney.

March 20, 1951 C. R. KNIGHT 2,546,033

MAGNETICALLY CONTROLLED ELECTRON DISCHARGE AMPLIFIER CIRCUITS

Filed June 7, 1946 2 Sheets-Sheet 2

Inventor:
Chester R. Knight,
by Merton D. Morse
His Attorney.

Patented Mar. 20, 1951 2,546,033

UNITED STATES PATENT OFFICE 2,546,033

MAGNETICALLY CONTROLLED ELECTRON DISCHARGE AMPLIFIER CIRCUITS

Chester R. Knight, Scotia, N. Y., assignor to General Electric Company, a corporation of New York Application June 7, 1946, Serial No. 674,945

3 Claims. (Cl. 179—171)

My invention relates to amplifiers and more particularly to amplifiers using electron discharge devices of the magnetically controlled type.

It is an object of my invention to provide an improved amplifier using magnetically controlled electron discharge devices.

It is a further object of my invention to provide an improved amplifier capable of amplifying electric signals varying at a slow rate.

An additional object of my invention is to provide an improved amplifier capable of amplifying electric signals varying at a very slow rate and which is inherently balanced so that zero output voltage is obtained with zero input voltage and positive or negative output voltage is obtained in accordance with the polarity of the input voltage.

A further object of my invention is to provide an improved amplifier capable of amplifying slowly varying electric signals but which is not sensitive to unpredictable changes in contact resistance.

Another object of this invention is to provide an amplifier in which the input circuit is entirely isolated from the output circuit and which may be arranged to provide any desired impedance transformation by means of simple changes in the circuit components.

Still another object of my invention is to provide an amplifier capable of amplifying slowly varying voltages or currents and which may be connected in tandem with other amplifiers of the same type without requiring a separate source of operating voltage.

Yet another object of this invention is to provide an improved amplifier using electron discharge devices of the magnetically controlled type which utilizes simple feedback means, which means may be arranged to provide positive or negative feedback.

Still another object of my invention is to provide an improved electron discharge device wherein the space current may be magnetically controlled.

An additional object of this invention is to provide an improved oscillator utilizing magnetically controlled electron discharge devices which may readily be constructed to operate at very low frequencies.

Figure 4:
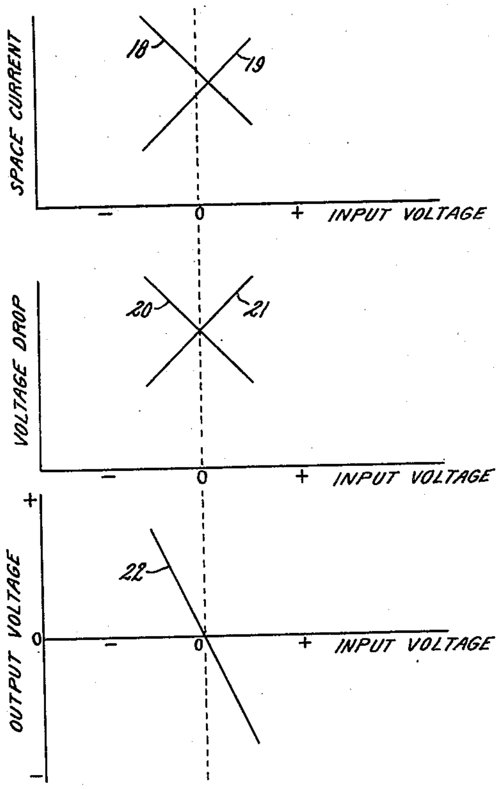
Figure 5:
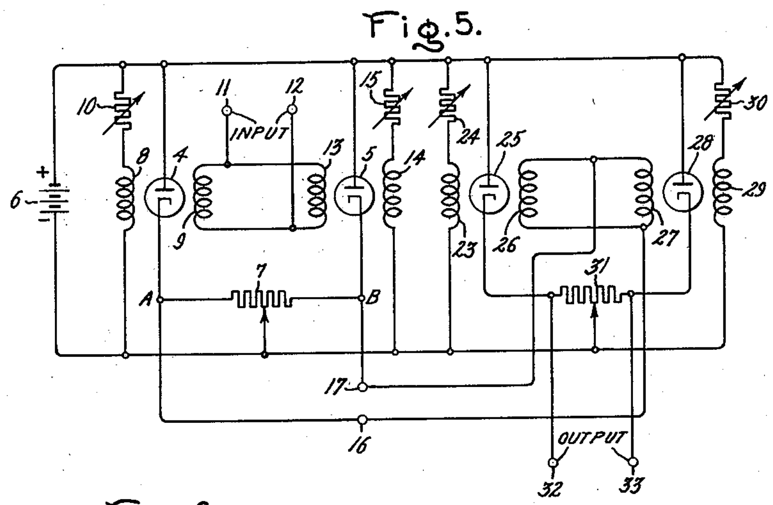
Figure 6:
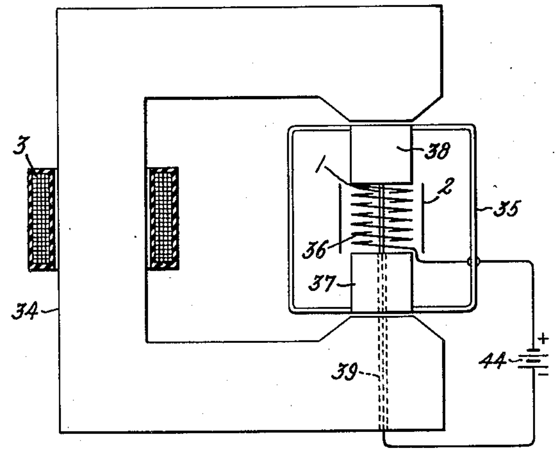
Figure 7:
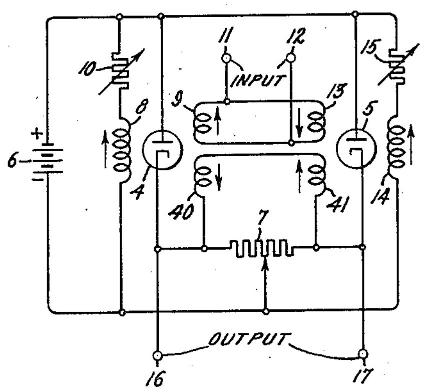
Figure 8:
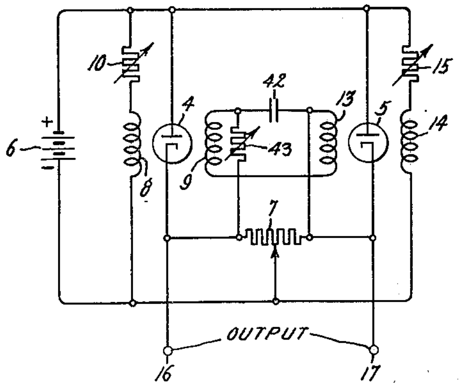

The novel features which I believe to be characteristic of my invention are set forth with particularity in the appended claims. My invention itself, both as to its organization and method of operation, together with further objects and advantages thereof may best be understood by reference to the following description taken in connection with the accompanying drawings in which Fig. 1 shows an electron discharge device of the type to which this invention is applicable, Fig. 2 shows the performance characteristics of the device of Fig. 1, Fig. 3 shows the circuit diagram of an amplifier constructed in accordance with this invention, Fig. 4 illustrates the operation of the amplifier of Fig. 3, Fig. 5 shows a two stage amplifier constructed in accord with my invention, Fig. 6 shows a modified electron discharge device of the type shown in Fig. 1, Fig. 7 shows the circuit diagram of a feedback amplifier constructed in accordance with my invention, and Fig. 8 shows an oscillator constructed in accordance therewith.

Figure 1:
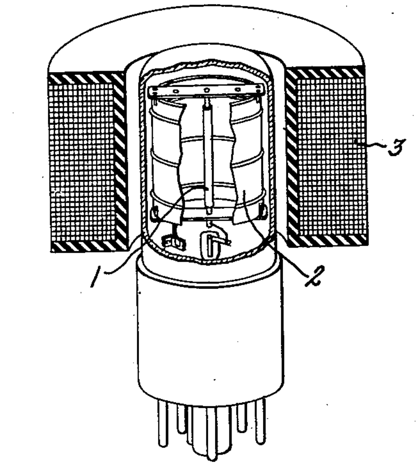

Referring now to Fig. 1, the electron discharge device to which this invention is applicable consists of a cylindrical anode 2 mounted about cathode 1 as an axis. Solenoid 3 is arranged to set up a magnetic field within the inter-electrode space of the device, this field being substantially along the axis of cathode 1. It is well known that in a device of this type the increased magnetic field associated with increasing current flow in coil 3 causes electrons from cathode 1 to follow a curved path in passing to anode 2. If the field strength is sufficient, the electrons never reach the anode and no space current flow takes place. Until this point is reached, however, the space current flow is nearly equal to the value determined by electron emission and space charge and is independent of magnetic flux.

Figure 2:
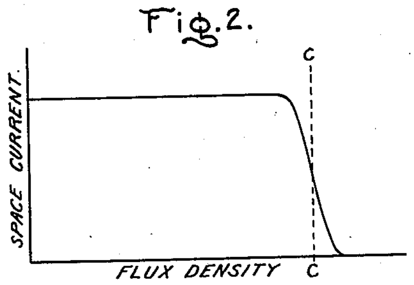

A number of factors combine to cause the space current cut-off of a device such as that shown in Fig. 1 to be a sharply sloping curve as shown in Fig. 2 rather than a discontinuous transition to zero at the cut-off flux density. Among these factors are the initial velocities of the electrons as they leave the cathode and fringing of the electric field at the ends of the anode. The latter effect causes space current to be cut-off along some portions of the cathode while not limiting current flow in other portions, thereby reducing the total space path current flow but not preventing it entirely.

Figure 3:
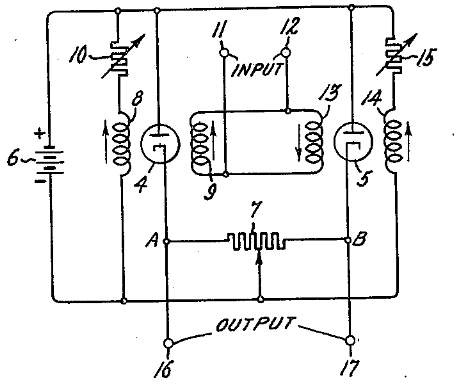

Fig. 3 shows an amplifier constructed in accordance with the principles of this invention. In the figure, 4 and 5 are electron discharge devices of the type shown in Fig. 1, the anode of each being connected to the positive terminal of unidirectional voltage source 6. The cathodes of devices 4 and 5 are connected to terminals A and B respectively, these points being connected to the negative terminal of source 6 through potentiometer 7. The magnetic field within device 4 is determined by the combined magnetomotive force of coils 8 and 9 and the magnetic field within device 5 determined by the total magnetomotive force of coils 13 and 14. Coil 8 is connected through variable resistance 10 to unidirectional voltage source 6 whereas coil 9 is connected to input terminals 11 and 12. Coil 14 is connected across unidirectional voltage source 5 by means of variable resistance 15 while coil 13 is connected to terminals 11 and 12. Output voltage is taken across terminals 16 and 17 which are connected to points A and B respectively.

Coils 8 and 9 and coils 13 and 14 are arranged in such fashion that current flow due to voltage applied across terminals 11 and 12 causes bucking magnetomotive force with respect to the flux in one electron discharge device and a reinforcing magnetomotive force as to flux in the other device. If, for example, input terminal 11 is positive with respect to input terminal 12, coil 9 may have the same direction of magnetization as coil 8 whereas coil 13 magnetizes in a direction opposing coil 14. This condition is indicated by the arrows of Fig. 3. On the other hand, if terminal 11 is negative with respect to terminal 12, current flow in coils 9 and 13 is reversed and coil 13 aids coil 14 in establishing flux in device 5 and coil 9 opposes coil 8 in establishing flux in device 4.

In operation, resistances 10 and 15 are adjusted until devices 4 and 5 are operating at substantially the mid-point of the region of space current cut-off. That is, the magnetomotive forces due to coils 8 and 14 are adjusted to produce flux densities within devices 4 and 5 of value corresponding to the dotted line C—C, Fig. 2. With the devices operating in this region, any small change in total magnetomotive force, such as would be due to current flow in coils 9 and 13, has a maximum effect on the space path current of each device. In addition, the position of the moving terminal of potentiometer 7 is adjusted until no voltage drop exists between points A and B, thereby compensating for any small differences in the space path current flow of devices 4 and 5 producing zero output voltage for the condition of zero current flow in coils 9 and 13.

Operation of the circuit of Fig. 3 when current is flowing in coils 9 and 13 is illustrated in Fig. 4. In this figure, curve 18 shows the space path current flow in device 4 as input terminal 11 is made positive with respect to input terminal 12. This decreasing current flow results from the reinforcing action of magnetomotive force from coil 9 which aids the flux produced by coil 8. Curve 19 shows a similar curve for device 5, this curve showing increasing current because the net flux in device 5 is reduced by the current flow in coil 13. In curves 20 and 21, the corresponding voltage drops across the two portions of potentiometer 7 are shown, curve 20 being the voltage drop between point A and the moving terminal of potentiometer 7 and curve 21 being the voltage drop between point B and the moving terminal of potentiometer 7. At zero input voltage, curves 20 and 21 cross by reason of the fact that potentiometer 7 is adjusted to produce no output voltage for this condition. Curve 22, Fig. 4, shows the output voltage across terminals 16 and 17 corresponding to curves 20 and 21. In this case the output voltage varies as the difference between these two curves.

From Fig. 4 it is evident that changes in input voltage to coils 9 and 13 are reproduced as changes in output voltage across terminals 16 and 17. Inasmuch as the power for the voltage across terminals 16 and 17 is derived from source 6, the system operates as an amplifier, converting the power in coils 9 and 13 to power of a different type and from a different source across terminals 16 and 17. Inasmuch as this power change does not require that the input voltage be varying to produce an output voltage, the system acts as a direct current amplifier and reproduces all input voltage variations even though the rate of change is exceedingly small. Furthermore, the input circuits are completely separated from the output circuits, thereby providing a high degree of stability and ease of adjustment.

One of the advantages of the circuit of Fig. 3 resides in the good stability obtained. In conventional amplifiers designed to amplify slowly varying changes in a signal potential, contact potentials within the electron discharge devices cause output voltage changes having no relation to the applied signal voltage. This voltage varies as the electron discharge device ages and as the operating temperature varies. Avoiding the undesirable consequences of these changes has proven a difficult problem, particularly when the signals of the order of a volt are to be amplified. In the circuit of Fig. 3, this difficulty is avoided because large cathode-anode space paths are provided in the electron discharge devices and contact potentials are not amplified.

In Fig. 5 a modified amplifier consisting of two stages is shown. The first stage, comprising devices 4 and 5 and having output terminals 16 and 17, is identical with that shown in Fig. 3, corresponding numerals indicating corresponding circuit components. The second stage, comprising devices 25 and 28 is of similar construction and has coils 26 and 27 connected to output terminals 16 and 17 of the first stage. Resistance 24 is adjusted to cause current flow in coil 23 to be of value to cause device 25 to operate at line C—C, Fig. 2, and resistance 30 is adjusted to produce current flow in coil 29 to operate device 28 at the same condition. Coil 26 opposes coil 23 and coil 27 aids coil 29 for one direction of voltage across terminals 16 and 17 and the reverse action occurs for the other direction of voltage across terminals 16 and 17. Potentiometer 31 is adjusted to produce no output voltage across terminals 32 and 33 when no voltage exists at input terminals 11 and 12.

One advantage of the tandem circuit shown in Fig. 5 is that only one source of unidirectional operating voltage is required for the complete system. This is due to isolation of the input and output circuits of each stage and permits any number of amplifiers to be operated from the same voltage source. This is in marked contrast to direct current amplifiers using conventional electron discharge devices as such amplifiers ordinarily require a separate source of operating voltage for each stage.

As an indication of the circuit values that might be used in an amplifier such as that shown in Fig. 5, the following values have been successfully used:

Source 6, 150 volts
Coils 9 and 13, 28 layers #20 wire wound on a 3 inch form
Coils 8, 14, 23 and 29, 30 layers #38 wire wound over coils 9, 13, 26, and 27 respectively
Coils 26 and 27, 30 layers #40 wire
Resistances 10, 15, 24, and 30, 6000 ohms (variable)
Potentiometers 7 and 31, 12,000 ohms
Devices 4, 5, 24, and 28, General Electric type 2B23.

This amplifier produces a power gain of about 4 to 1 and a voltage gain of approximately 100 to 1.

A further feature of the amplifiers of Figs. 3 and 5 resides in the impedance transformations that can be achieved. If, for example, 10 ampere turns in coils 9 and 13 are required to produce the desired output voltage change, this magnetomotive force may for example, be obtained by any of the following coil combinations:

| Turns | Current | Resistance |
|---|---|---|
| | *Amperes* | |
| 1 | 10 | 1 |
| 10 | 1 | 10 |
| 100 | 0.1 | 100 |
| 1,000 | 0.01 | 1,000 |
| 10,000 | 0.001 | 10,000 |
| 100,000 | 0.0001 | 100,000 |

From the standpoint of operation of the amplifier any of these coil combinations may be used and it is merely necessary to select a coil having resistance of optimum value from the standpoint of the source of input voltage. If a high impedance source, such as an electrocardiograph, an encephalograph, or a photocell, is encountered, coils having a very great number of turns can be used. On the other hand, if the source has low impedance and produces relatively large current at low voltage, a small number of turns can be used in the coils. In either event the remaining portions of the amplifier are identical and only the coils need be changed.

Fig. 6 shows the magnetically controlled electron discharge device of Fig. 1 modified to improve the amplification thereof when used in an amplifier such as shown in Fig. 3. An iron core comprising external member 34 and internal members 37 and 38 is provided to limit the length of the flux path in air to the active length of the space path of the electron discharge device, thereby reducing the magnetomotive force requirement to that actually required to produce flux across space path of the electron discharge device. This produces a corresponding reduction in the magnetomotive force of the control coils and thus reduces the input power requirements. Electrical connections to cathode 1 can be made by a small hole 39 passing through members 37 and 34.

Another feature of the device shown in Fig. 6 is the screen grid electrode 36 placed between the cathode and anode. This electrode acts in a manner similar to the screen grid of a conventional electron discharge device, increasing the amplification factor and space path resistance and electrostatically isolating the anode from the cathode. Constant bias voltage is applied to this electrode from unidirectional voltage source 44. In addition a space charge or suppressor grid can be added to the device.

Fig. 7 shows a modification of the amplifier of Fig. 3 providing feedback effects. This is accomplished by coils 40 and 41 which are arranged to produce flux in the space path of electron discharge devices 4 and 5. If negative feedback is desired, these coils are wound to provide a magnetomotive force in opposition to the magnetomotive force of coils 9 and 13, thereby reducing the apparent input magnetomotive force and producing the greater fidelity, lower output impedance, improved stability, and other features of negative feedback amplifiers. Positive feedback can be achieved by reversing the magnetomotive forces of these coils, thus providing greater amplification and increased input impedance at a sacrifice of stability and fidelity.

In Fig. 8, the amplifier of Fig. 3 is arranged as a feedback oscillator. Control coils 9 and 13 are connected in series with capacitor 42 and the combined circuit connected through resistance 43 to output terminals 16 and 17. Feedback voltage adjustment is provided by varying the value of resistance 43. With this circuit, coils 9 and 13 are wound in directions such that the magnetomotive forces they produce as a result of a predetermined polarity between terminals 16 and 17 is of the same direction as the magnetomotive forces required to produce output voltage of that polarity if the system is operated as an amplifier. With resistance 43 adjusted to provide a sufficient amount of feedback, oscillations are thus produced by the circuit of Fig. 8, the frequency of the oscillations being determined by the natural resonant frequency of condenser 42 operating in connection with coils 9 and 13.

One of the features of the oscillator of Fig. 8 is the low oscillating frequency that can be obtained. Coils 9 and 13 may be chosen to have a very large value of inductance by using a large number of turns of small size wire. This large inductance, in conjunction with a reasonably large value of capacitor 42, provides a circuit having an exceedingly low resonant frequency (i. e. 10 cycles per second or less). The resultant oscillations may then be used to control devices such as electric signs where it is desired to provide a uniform periodic change at low frequency.

While I have shown and described my invention as applied to a particular system of connections and embodying various devices diagrammatically shown, it will be obvious to those skilled in the art that changes and modifications may be made without departing therefrom, and I, therefore, aim in the appended claims to cover all such changes and modifications as fall within the true spirit and scope of my invention.

What I claim as new and desire to secure by Letters Patent of the United States is:

1. An amplifier comprising two electron discharge devices, each having an anode and a cathode, an output resistance directly connected between said cathodes, a source of unidirectional potential having a positive and a negative terminal, means for connecting the positive terminal of said source directly to both of said anodes, means for connecting the negative terminal of said source to a movable tap on said resistance, means for producing a magnetic flux in each of said devices of value corresponding to a region of relatively large space current change for small change in magnetic flux comprising respective windings for each of said devices connected in parallel across said source, an input circuit including means to aid the flux produced in one device and means to oppose flux produced in said other device when applied voltage is of one polarity, and having the opposite effect when said applied voltage is of the opposite polarity, and an output circuit connected directly across the said resistance.

2. An amplifier comprising two electron discharge devices each having an anode, and a cathode, an output impedance coupled between each of said cathodes, means to supply space path voltage for said devices coupled between each of said anodes and an adjustable point on said output impedance, means to produce magnetic flux in each of said devices of magnitude corresponding to a region of relatively large space current change for small change in magnetic flux, an input circuit, said input circuit including means to aid flux from said second means in one device and to oppose flux from said second means in said other device when an applied voltage is of one polarity and having the opposite effect when said applied voltage is of opposite polarity, a utilization circuit connected directly across said output impedance and means to alter the flux in said devices in accordance with the voltage across said output impedance comprising respective windings for each of said devices connected in series across said output impedance.

3. A multistage amplifier having two pairs of electron discharge devices, each of said devices having an anode, and a cathode, a respective output resistance connected between the cathodes of each pair of said devices, a common source of unidirectional potential connected between each of said anodes, and respective taps on each of said resistances, respective windings for the devices in each pair to produce magnetic flux in each of said devices of magnitude corresponding to a region of relatively large change in space current for small change in magnetic flux, an input circuit, said input circuit including means to increase the flux of one of said devices of one pair and to decrease the flux in the other of said devices of said one pair in accord with the value of an applied electromotive force, means responsive to the difference in space current flow between said last mentioned devices to increase the flux in one of the remaining of said devices and to decrease the flux in another of the remaining of said devices, a utilization device, and means to apply voltage to said utilization device in accordance with the difference in space current flows of said last two mentioned devices.

CHESTER R. KNIGHT.

REFERENCES CITED

The following references are of record in the file of this patent:

UNITED STATES PATENTS

| Number | Name | Date |
|---|---|---|
| 1,530,364 | Hennelly | Mar. 17, 1925 |
| 1,535,082 | Alexanderson | Apr. 21, 1925 |
| 1,552,219 | Mercer | Sept. 1, 1925 |
| 1,586,570 | Nichols | June 1, 1926 |
| 1,593,373 | Vander Bijl | July 20, 1926 |
| 1,816,682 | Langmuir | July 28, 1931 |
| 2,013,093 | Frantz | Sept. 3, 1935 |
| 2,071,923 | Frantz | Feb. 23, 1937 |
| 2,296,764 | Braden | Sept. 22, 1942 |
| 2,432,748 | Glass | Dec. 16, 1947 |